United States Patent
Hoshi et al.

(10) Patent No.: US 9,217,208 B2
(45) Date of Patent: Dec. 22, 2015

(54) APPARATUS FOR PRODUCING SINGLE CRYSTAL

(75) Inventors: Ryoji Hoshi, Nishishirakawa (JP); Kiyotaka Takano, Nishishirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 1163 days.

(21) Appl. No.: 12/744,606

(22) PCT Filed: Dec. 18, 2008

(86) PCT No.: PCT/JP2008/003829
§ 371 (c)(1),
(2), (4) Date: May 25, 2010

(87) PCT Pub. No.: WO2009/087724
PCT Pub. Date: Jul. 16, 2009

(65) Prior Publication Data
US 2010/0258050 A1    Oct. 14, 2010

(30) Foreign Application Priority Data

Jan. 10, 2008 (JP) ................................. 2008-003164

(51) Int. Cl.
*C30B 15/20* (2006.01)
*C30B 29/06* (2006.01)
(Continued)

(52) U.S. Cl.
CPC .................. *C30B 29/06* (2013.01); *C30B 15/14* (2013.01); *C30B 15/20* (2013.01); *C30B 35/00* (2013.01); *Y10T 117/1068* (2015.01)

(58) Field of Classification Search
CPC ........ C30B 15/00; C30B 15/20; C30B 35/00; C30B 15/14
USPC .............. 117/200, 206, 208, 217, 222, 13, 34
See application file for complete search history.

(56) References Cited

U.S. PATENT DOCUMENTS

| 4,330,362 | A |   | 5/1982 | Zulehner |         |
|-----------|---|---|--------|----------|---------|
| 5,316,742 | A | * | 5/1994 | Tomioka et al. | 117/217 |

(Continued)

FOREIGN PATENT DOCUMENTS

| JP | B2-57-40119 | 8/1982 |
| JP | A-63-64990  | 3/1988 |

(Continued)

OTHER PUBLICATIONS

Patent Abstracts of Japan, English Abstract and English Computer Translation of JP 06-287098 (2013).*

(Continued)

*Primary Examiner* — Matthew Song
(74) *Attorney, Agent, or Firm* — Oliff PLC

(57) ABSTRACT

The present invention is an apparatus for producing a single crystal, growing the single crystal by the Czochralski method and comprising at least: a main chamber in which a crucible for accommodating a raw material melt and a heater for heating the raw material melt are arranged; a pulling chamber into which the grown single crystal is pulled and accommodated, the pulling chamber being continuously provided above the main chamber; and a cooling cylinder extending at least from a ceiling of the main chamber toward a surface of the raw material melt so as to surround the single crystal during pulling, the cooling cylinder being forcibly cooled with a cooling medium. As a result, there is provided an apparatus for producing a single crystal that can increase the growth rate of the single crystal by efficiently cooling the single crystal during the growth.

14 Claims, 2 Drawing Sheets

(51) Int. Cl.
*C30B 35/00* (2006.01)
*C30B 15/14* (2006.01)

(56) References Cited

U.S. PATENT DOCUMENTS

| | | | | |
|---|---|---|---|---|
| 6,036,776 | A | * | 3/2000 | Kotooka et al. ............... 117/217 |
| 2002/0144641 | A1 | * | 10/2002 | Inagaki et al. ................. 117/13 |
| 2003/0070605 | A1 | * | 4/2003 | Hoshi et al. .................... 117/13 |

FOREIGN PATENT DOCUMENTS

| | | | |
|---|---|---|---|
| JP | A-64-65086 | 3/1989 | |
| JP | A-4-321584 | 11/1992 | |
| JP | A-6-199590 | 7/1994 | |
| JP | 06287098 A | * 10/1994 | ............. C30B 15/14 |
| JP | A-11-157996 | 6/1999 | |
| JP | A-2000-291752 | 10/2000 | |
| JP | 3203341 | 6/2001 | |
| JP | A-2005-231969 | 9/2005 | |
| WO | WO 01/57293 A1 | 8/2001 | |

OTHER PUBLICATIONS

May 25, 2010 Office Action issued in corresponding Japanese Patent Application No. 2008-003164 (with partial translation).
Mar. 17, 2009 International Search Report issued in corresponding International Patent Application No. PCT/JP2008/003829.
Mar. 27, 2012 Office Action issued in Chinese Patent Application No. 200880124024.0 (with partial translation).
Written Opinion of the International Searching Authority dated Sep. 16, 2010 in International Patent Application No. PCT/JP2008/003829.

* cited by examiner

APPARATUS FOR PRODUCING SINGLE CRYSTAL

TECHNICAL FIELD

The present invention relates to an apparatus for producing a silicon single crystal by the Czochralski method (hereinafter, referred to as the CZ method).

BACKGROUND ART

Hereinafter, a conventional apparatus for producing a silicon single crystal by the Czochralski method will be explained by exemplifying growing a silicon single crystal.

FIG. 4 shows a schematic sectional view of an example of the conventional apparatus for producing a silicon single crystal.

In the apparatus for producing a single crystal 101 used for producing a silicon single crystal by the CZ method, crucibles 106 and 107, and a heater 108 are generally arranged in a main chamber 102 where the single crystal 104 is grown, the crucibles which accommodate a raw material melt 105 and can be moved upwardly and downwardly, the heater which is arranged so as to surround the crucibles 106 and 107. A pulling chamber 103 for accommodating and taking out the grown single crystal is continuously provided above the main chamber 102. The crucibles 106 and 107 are supported with a crucible rotating shaft 118 that can be rotated and moved upwardly and downwardly by a rotation drive mechanism (not shown) installed at a lower portion of the apparatus for producing a single crystal 101.

A heat insulating member 109 for preventing the main chamber 102 from being directly exposed to heat from the heater 108 is provided outside the heater 108 so as to surround a perimeter of the heater.

For the purpose of discharging impurities generated in the furnace out of the furnace etc., an inert gas such as argon gas is introduced into the chambers from a gas inlet 111 provided at an upper portion of the pulling chamber 103, passes through the single crystal 104 during pulling and a surface of the raw material melt 105 to circulate inside the chambers, and is discharged from a gas outlet 110. There is provided a gas flow-guide cylinder 114 for guiding the inert gas so as to flow downwardly near the crystal from above the melt.

The cooling cylinder 112 extends at least from a ceiling of the main chamber 102 toward the surface of the raw material melt 105 so as to surround the single crystal 104 during pulling. A cooling medium is introduced into the cooling cylinder 112 from a cooling medium inlet 113, circulates through the inside of the cooling cylinder 112 to forcibly cool the cooling cylinder 112, and then is discharged outside.

In the case of producing the single crystal by using the apparatus for growing a single crystal 101 as described above, a seed crystal 116 is immersed in the raw material melt 105 and carefully pulled upwardly with being rotated to grow a rod-shaped single crystal, while the crucibles 106 and 107 are moved upwardly according to the growth of the crystal so that the melt surface is always maintained at a constant height in order to obtain a desired diameter and desired crystal quality.

When the single crystal is grown, the seed crystal 116 attached to a seed holder 117 is immersed in the raw material melt 105, and then a wire 115 is carefully wound up with rotating the seed crystal 116 in a desired direction with a pulling mechanism (not shown) to grow the single crystal 104 at an end portion of the seed crystal 116. Here, in order to eliminate dislocations generated when the seed crystal 116 is brought into contact with the melt, the crystal is once made thin to a diameter of about 3 to 5 mm in an early stage of the growth, and then the diameter is increased up to a desired diameter after the dislocations are eliminated so as to grow the single crystal 104 having desired quality.

In this case, a pulling rate for a portion having a constant diameter of the single crystal 104, although depending on the diameter of the single crystal to be pulled, is usually extremely slow, for example, about 0.4 to 2.0 mm/min. If it is pulled fast by constraint, the single crystal during the growth is deformed and consequently a cylindrical product having a constant diameter can be no longer obtained, or there arise problems that slip dislocations are generated in the single crystal 104, the single crystal 104 cannot be a product by being detached from the melt and the like. Thus, increasing the growth rate of the single crystal is limited.

However, for the purpose of improving productivity and reducing cost in the foregoing production of single crystal 104 by the CZ method, the increase in the growth rate of the single crystal 104 is one of considerable means, and accordingly various improvements have been hitherto made in order to achieve the increase in the growth rate of the single crystal 104.

It is known that the growth rate of the single crystal 104 is determined by heat balance of the single crystal 104 during the growth and can be increased by efficiently removing the heat emitted from a surface of the single crystal. In the case, an enhancement of a cooling effect on the single crystal 104 enables the single crystal to be further efficiently produced. Furthermore, it is known that a cooling speed of the single crystal 104 varies crystal quality. For example, Grown-in defects formed in the silicon single crystal during the growth of the single crystal can be controlled by a ratio of the pulling rate (the growth rate) to a temperature gradient in the crystal, and a defect-free single crystal can be grown by the control (See Japanese Patent Laid-open (Kokai) No. H11-157996). Thus, the enhancement of the cooling effect on the single crystal during the growth is important for producing the defect-free single crystal and for improvement productivity by increasing the growth rate of the single crystal.

In order to efficiently cool the single crystal 104 in the CZ method, effective is a method of absorbing radiant heat from the single crystal 104 into an object that is forcibly cooled such as the chamber without directly exposing the crystal to radiant heat from the heater 108. Screen structure is apparatus structure that can realize this (See Japanese Patent Publication No. S57-40119). However, in this structure, screen shape for avoiding contact due to the upward movement of the crucible needs a smaller diameter of a screen upper portion. The screen structure therefore has fault such that it is difficult to cool the crystal.

In addition, there is also a problem such that the cooling effect on the single crystal cannot be utilized, the effect which is brought about by flowing the inert gas during crystal pulling to prevent contamination due to an oxidizing gas.

In view of this, there is proposed structure that comprises a gas flow-guide cylinder for guiding the inert gas and a heat shielding ring for shielding the direct radiant heat from the heater and the raw material melt to the gas flow-guide cylinder (See Japanese Patent Laid-open (Kokai) No. S64-65086). In this method, the cooling effect of the inert gas on the single crystal can be expected. However, considering the radiant heat from the single crystal is absorbed into a cooling chamber, it cannot be said that its cooling capacity is high.

Thereupon, as a method for solving the problems of the screen and the gas flow-guide cylinder and for efficiently cooling, there is proposed a method of arranging a water-cooled cooling cylinder around the crystal (See International Publication Pamphlet WO01/57293). In this method, an outside of the cooling cylinder is protected by a cooling-cylinder-protection material such as a protection cover made of graphite etc., and thereby the heat of the single crystal can be efficiently removed from the inside of the cooling cylinder. However, since the cooling cylinder does not extend to near the melt surface for safety, the cooling effect on the single crystal is somewhat low in a portion before reaching the cooling cylinder.

Moreover, there is disclosed a method of extending a graphite member etc. fitted into the cooling cylinder in Japanese Patent Laid-open (Kokai) No. H6-199590. However, this method cannot exert a sufficient cooling effect since the cooling cylinder and the extending graphite member are exposed to the heat from the outside and besides contact between the cooling cylinder and the graphite member is difficult. Consequently, the heat cannot be efficiently conducted from the graphite member to the cooling cylinder.

DISCLOSURE OF INVENTION

In view of the above-explained problems, it is an object of the present invention to provide an apparatus for producing a single crystal that can increase the growth rate of the single crystal by efficiently cooling the single crystal during the growth.

To achieve this object, the present invention provides an apparatus for producing a single crystal, growing the single crystal by the Czochralski method and comprising at least: a main chamber in which a crucible for accommodating a raw material melt and a heater for heating the raw material melt are arranged; a pulling chamber into which the grown single crystal is pulled and accommodated, the pulling chamber being continuously provided above the main chamber; and a cooling cylinder extending at least from a ceiling of the main chamber toward a surface of the raw material melt so as to surround the single crystal during pulling, the cooling cylinder being forcibly cooled with a cooling medium; wherein the apparatus further comprises at least an auxiliary cooling cylinder fitted into an inside of the cooling cylinder, and the auxiliary cooling cylinder has a gap penetrating in an axial direction and extends toward the surface of the raw material melt.

In this manner, since the apparatus for producing a single crystal according to the present invention has at least the auxiliary cooling cylinder fitted into the inside of the cooling cylinder and the auxiliary cooling cylinder has the gap penetrating in an axial direction and extends toward the surface of the raw material melt, the auxiliary cooling cylinder comes into tightly close contact with the cooling cylinder to fit without breaking due to thermal expansion, and heat absorbed from the single crystal during the growth with the auxiliary cooling cylinder can be efficiently conducted from the fitted portion to the cooling cylinder. As a result, the single crystal during the growth can be efficiently cooled and the growth rate of the single crystal can be increased.

In this case, it is preferable that a material of the auxiliary cooling cylinder is any of graphite, carbon composite (CC material), stainless, molybdenum and tungsten.

In this manner, when the material of the auxiliary cooling cylinder is any of carbon material such as graphite and carbon composite (CC material), metal material such as stainless, molybdenum and tungsten, the heat can be more efficiently absorbed from the single crystal. In addition, the heat can be more efficiently conducted to the cooling cylinder. Also, heat resistance of the auxiliary cooling cylinder can be made high.

In this case, a protection member is preferably provided outside the cooling cylinder.

In this manner, when the protection member is provided outside the cooling cylinder, it can be reduced that an outside of the cooling cylinder is directly exposed to the radiant heat from the heater and the raw material melt. In addition, the raw material melt can be prevented from splashing to adhere to the cooling cylinder. As a result, the cooling cylinder can be prevented from deteriorating, the single crystal during the growth, which is located inside the cooling cylinder, can be more efficiently cooled, and the effect to increase the growth rate of the single crystal can be enhanced.

In this case, at is preferable that a material of the protection member is any of graphite, carbon fiber, carbon composite (CC material), stainless, molybdenum and tungsten.

In this manner, when the material of the protection member is any of carbon material such as graphite, carbon fiber and carbon composite (CC material), metal material such as stainless, molybdenum and tungsten, emissivity of the protection member can be made high, thereby the effect to reduce the exposure of the cooling cylinder to the direct radiant heat from the heater and the raw material melt can be more enhanced. Also, heat resistance of the protection member can be made high.

In this case, the apparatus is preferably provided with a gas flow-guide cylinder extending below the cooling cylinder.

In this manner, when the apparatus is provided with the gas flow-guide cylinder extending below the cooling cylinder, the single crystal can be cooled by shielding the radiant heat from the heater and the raw material melt. In addition, the cooling cylinder is prevented from approaching a position immediately above the melt surface so that safety is secured. At the same time, the gas flow-guide cylinder exerts an effect to guide the inert gas flowing downwardly near the crystal from above the raw material melt, and thereby the cooling effect of the inert gas on the single crystal can be also expected. Consequently, the single crystal during the growth can be more efficiently cooled and the effect to increase the growth rate of the single crystal can be enhanced.

The apparatus for producing a single crystal according to the present invention has at least the auxiliary cooling cylinder fitted into the inside of the cooling cylinder, and the auxiliary cooling cylinder has the gap penetrating in an axial direction and extends toward the surface of the raw material melt, and thereby the auxiliary cooling cylinder comes into tightly close contact with the cooling cylinder to fit without breaking due to thermal expansion, and the heat absorbed from the single crystal during the growth with the auxiliary cooling cylinder can be efficiently conducted from the fitted portion to the cooling cylinder. As a result, the single crystal during the growth can be efficiently cooled and the growth rate of the single crystal can be increased.

BEST MODE FOR CARRYING OUT THE INVENTION

Hereinafter, an embodiment according to the present invention will be explained, but the present invention is not restricted thereto.

In the conventional production of the single crystal by the CZ method, the increase in the growth rate of the single crystal is one of considerable means to improve productivity and to reduce cost. It is known that the growth rate of the single crystal can be increased by efficiently removing the heat emitted from the surface of the single crystal. In addition, the enhancement of the cooling effect on the single crystal during the growth is also important for producing the defect-free single crystal.

In view of this, the present inventor repeatedly keenly conducted studies to enhance the cooling effect on the single crystal during the growth. As a result, the present inventor found that the heat can be efficiently absorbed from the single crystal during the growth with the auxiliary cooling cylinder that is fitted into the inside of the cooling cylinder and that extends toward the surface of the raw material melt below the cooling cylinder. Furthermore, the present inventor thought of the following. That is, when the auxiliary cooling cylinder has the gap penetrating in an axial direction, the auxiliary cooling cylinder is tightly fitted into the cooling cylinder without breaking at the time of expanding the auxiliary cooling cylinder by the heat, a contact area of both surfaces consequently increases, and the auxiliary cooling cylinder comes into sufficiently close contact with the cooling cylinder. The heat absorbed from the single crystal can be therefore efficiently conducted to the cooling cylinder that is forcibly cooled. As a result, the present inventor brought the present invention to completion.

That is, the apparatus for producing a single crystal according to the present invention has at least the auxiliary cooling cylinder fitted into the inside of the cooling cylinder that is forcibly cooled, and the auxiliary cooling cylinder has the gap penetrating in an axial direction and extends toward the surface of the raw material melt, thereby can efficiently cool the single crystal during the growth, and can increase the growth rate of the single crystal.

Figure 1:
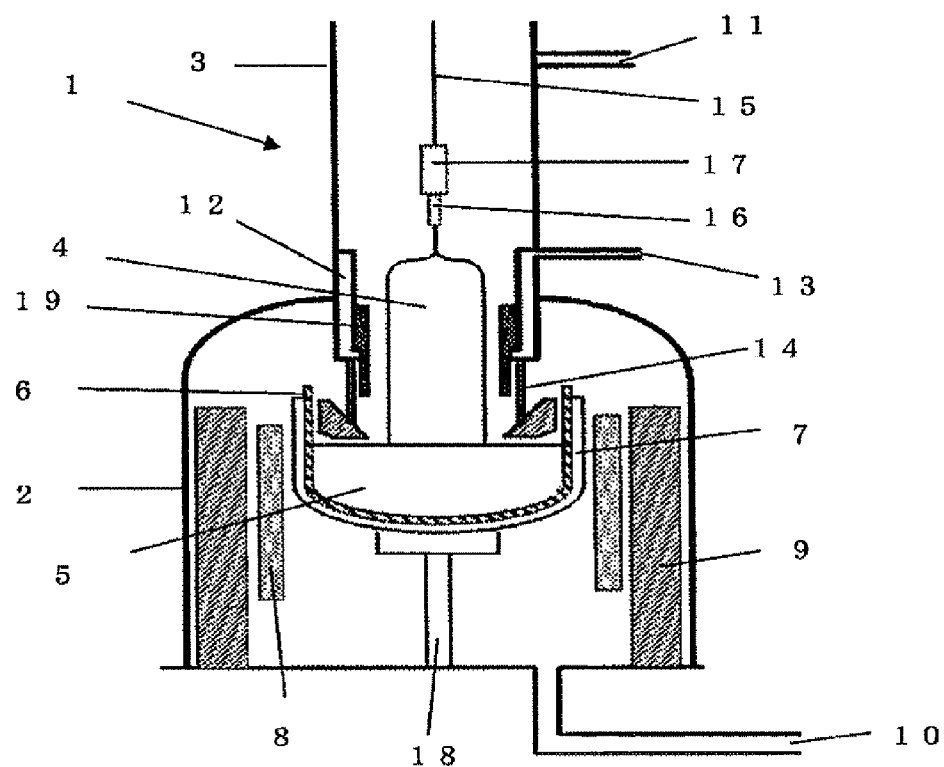
FIG. 1 is a schematic sectional view showing an embodiment of the apparatus for producing a single crystal according to the present invention.

FIG. 1 is a schematic sectional view showing an example of the apparatus for producing a single crystal according to the present invention.

As shown in FIG. 1, in the apparatus for producing a single crystal 1, the crucibles 6 and 7 for accommodating the raw material melt 5, the heater 8 for heating and melting a polycrystalline silicon raw material and the like are arranged in the main chamber 2. A pulling mechanism (not shown) for pulling the grown single crystal 4 is provided at an upper portion of the pulling chamber 3 that is continuously provided above the main chamber 2.

A pulling wire 15 is reeled out from the pulling mechanism installed at the upper portion of the pulling chamber 3, and a seed holder 17 for attaching a seed crystal 16 is connected at the end of the pulling wire. The single crystal 4 is formed below the seed crystal 16 by immersing the seed crystal 16 attached at the end of the seed holder 17 in the raw material melt 5 and by winding up the pulling wire 15 with the pulling mechanism.

It is to be noted that the foregoing crucibles 6 and 7 are composed of an inside quartz crucible 6 for directly accommodating the raw material melt 5 and an outside graphite crucible 7 for supporting the quartz crucible 6. The crucibles 6 and 7 are supported with a crucible rotating shaft 18 that can be rotated and moved upwardly and downwardly by a rotation drive mechanism (not shown) installed at the lower portion of the apparatus for producing a single crystal 1. The crucibles 6 and 7 are moved upwardly for a distance corresponding to an amount of decrease in the melt according to the pulling of the single crystal 4 with being rotated in the opposite direction to a rotation of the crystal so that the melt surface is maintained at a constant height in order to prevent change in a crystal diameter and crystal quality that is caused by the change of the melt surface in the apparatus for producing a single crystal 1.

The heater 8 is arranged so as to surround the crucibles 6 and 7. A heat insulating member 9 for preventing the main chamber 2 from being directly exposed to the heat from the heater 8 is provided outside the heater 8 so as to surround a perimeter of the heater.

For the purpose of discharging impurities generated in the furnace out of the furnace etc., the inert gas such as argon gas is introduced into the chambers from a gas inlet 11 provided at the upper portion of the pulling chamber 3, passes through the single crystal 4 during pulling and the surface of the raw material melt 5 to circulate inside the chambers, and is discharged from a gas outlet 10.

It is to be noted that the main chamber 2 and the pulling chamber 3 are formed out of metal that is excellent in heat resistance and heat conductivity such as stainless, and cooled with water through a cooling pipe (not shown).

The cooling cylinder 12 extends at least from the ceiling of the main chamber 2 toward the surface of the raw material melt 5 so as to surround the single crystal 4 during pulling. A cooling medium is introduced into the cooling cylinder 12 from a cooling medium inlet 13, circulates through the inside of the cooling cylinder 12 to forcibly cool the cooling cylinder 12, and then is discharged outside.

When the single crystal is grown, the seed crystal 16 attached to a seed holder 17 is immersed in the raw material melt 5, and then the wire 15 is carefully wound up with rotating the seed crystal 16 in a desired direction with the pulling mechanism (not shown) to grow the single crystal 4 at the end portion of the seed crystal 16. Here, in order to eliminate dislocations generated when the seed crystal is brought into contact with the melt, the crystal is once made thin to a diameter of about 3 to 5 mm in an early stage of the growth, and the diameter is increased up to a desired diameter after the dislocations are eliminated so as to grow the single crystal 4 having desired quality. Instead, the single crystal 4 can be grown without performing necking by using the dislocation-free seeding method in which the seed crystal 16 having a pointed tip is used, the seed crystal 16 is carefully brought into contact with the raw material melt 5 to immerse the seed crystal up to a predetermined diameter, and then the seed crystal is pulled.

The apparatus for producing a single crystal according to the present invention is provided with the auxiliary cooling cylinder 19 fitted into the inside of the cooling cylinder 12. The auxiliary cooling cylinder 19 extends toward the surface of the raw material melt 5 below the cooling cylinder 12.

When the auxiliary cooling cylinder 12 is arranged which is fitted into the inside of the cooling cylinder 12 and extends toward the surface of the raw material melt 5 below the cooling cylinder 12 as described above, the auxiliary cooling cylinder 19 can surround up to below the single crystal 4 during the growth, and thereby the heat can be efficiently absorbed from the single crystal 4.

Figure 2:
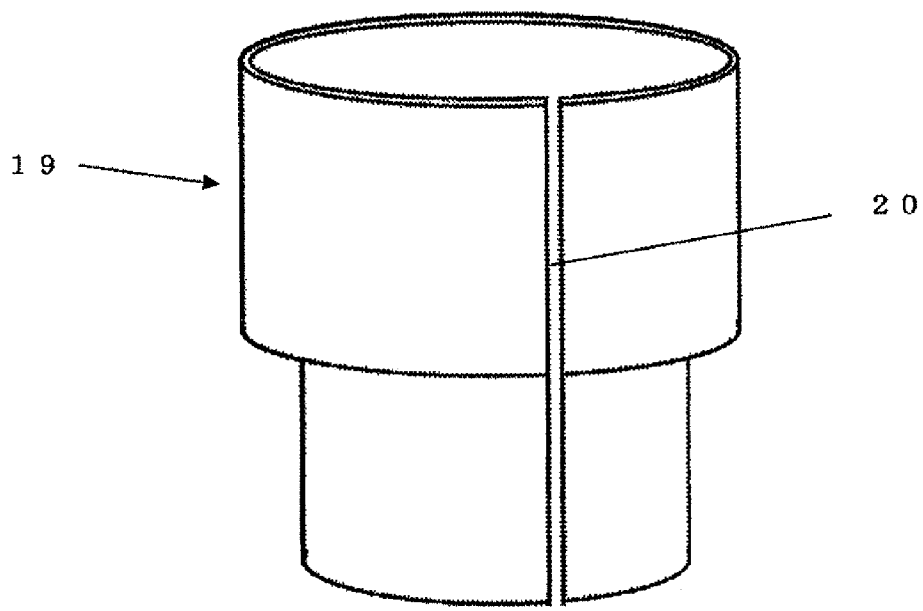
FIG. 2 is a schematic view showing an example of the auxiliary cooling cylinder that can be used in the present invention.

FIG. 2 shows an example of the auxiliary cooling cylinder that can be used in the present invention.

As shown in FIG. 2, the auxiliary cooling cylinder 19 has the gap 20 penetrating in an axial direction.

If an inner diameter of the cooling cylinder 12 and an outer diameter of the auxiliary cooling cylinder 19 are merely equalized to fit the auxiliary cooling cylinder 19 into the inside of the cooling cylinder 12, it is difficult to attach and detach the auxiliary cooling cylinder 19. However, when the auxiliary cooling cylinder 19 has the gap 20 penetrating in an axial direction, the auxiliary cooling cylinder 19 can be easily attached and detached. In addition, a break in the auxiliary cooling cylinder 19 can be prevented which is caused by a difference of thermal expansion between the cooling cylinder 12 and the auxiliary cooling cylinder 19 during the growth of the single crystal 4. That is, since the cooling cylinder 12 is forcibly cooled with the cooling medium, the cooling cylinder 12 is not so expanded. On the other hand, the auxiliary cooling cylinder 19 is expanded. Furthermore, the auxiliary cooling cylinder 19 is tightly fitted into the cooling cylinder 12 due to the thermal expansion of the auxiliary cooling cylinder 19, consequently a contact area of both surfaces increases, and the auxiliary cooling cylinder comes into sufficiently close contact with the cooling cylinder. As a result, the heat can be efficiently conducted from the auxiliary cooling cylinder 19 to the cooling cylinder 12.

Here, when a width of the gap 20 is less than 180°, the auxiliary cooling cylinder 19 comes into close contact with the cooling cylinder 12 due to the thermal expansion, and thereby an effect to enhance efficiency of the heat conduction from the auxiliary cooling cylinder 19 to the cooling cylinder 12 can be achieved. Moreover, a smaller width of the gap 20 is more preferable, as long as it is not less than the width by which the auxiliary cooling cylinder 19 does not break due to the thermal expansion.

In this case, it is preferable that the material of the auxiliary cooling cylinder 19 is any of graphite, carbon composite (CC material), stainless, molybdenum and tungsten.

When the material of the auxiliary cooling cylinder 19 is any of carbon material such as graphite and carbon composite (CC material), metal material such as stainless, molybdenum and tungsten as described above, the heat can be more efficiently absorbed from the single crystal 4. In addition, the absorbed heat can be more efficiently conducted to the cooling cylinder 12 that is forcibly cooled. Also, heat resistance of the auxiliary cooling cylinder can be made high. The material of the auxiliary cooling cylinder 19 is not restricted thereto, and any materials having a high thermal conductivity and emissivity can be adopted.

A conventional apparatus for producing a single crystal has the problem such that when the cooling cylinder 12 is exposed to the radiant heat of the heater 8, the raw material melt 5 and the like from its outside, the capacity of the cooling cylinder to absorb the heat from the single crystal 4 decreases in its inside. In view of this, the cooling effect on the crystal, which is located inside, can be more enhanced by providing with the protection member for protecting the cooling cylinder 12 from the heat and the like and for preventing the cooling effect of the cooling cylinder from decreasing, outside the cooling cylinder 12.

Figure 3:
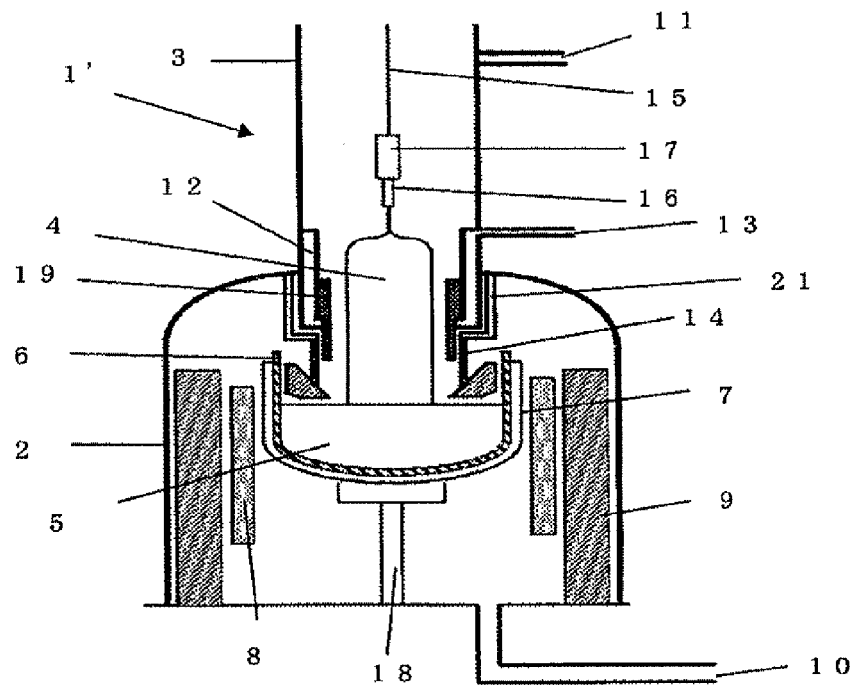
FIG. 3 is a schematic sectional view showing another embodiment of the apparatus for producing a single crystal according to the present invention.

FIG. 3 shows an example of the apparatus for producing a single crystal according to the present invention provided with the protection member.

As shown in FIG. 3, the apparatus for producing a single crystal 1' according to the present invention is provided with the protection member 21 outside the cooling cylinder 12, and thereby it can be reduced that the outside of the cooling cylinder 12 is directly exposed to the radiant heat from the heater 8 and the raw material melt 5. Consequently, the single crystal 4 during the growth, which is located inside, can be more efficiently cooled, and the effect to increase the growth rate of the single crystal 4 can be enhanced. In addition, breakage, damage due to melting and the like of the cooling cylinder 12 can be prevented which are caused by the raw material melt 5 that splashes to adhere to the outside of the cooling cylinder 12, for example, while the raw material is melted.

It is preferable that the protection member 21 does not come into contact with the cooling cylinder 12 so as not to conduct the heat to the cooling cylinder 12. However, the present invention is not restricted thereto.

In this case, it is preferable that the material of the protection member 21 is any of graphite, carbon fiber, carbon composite (CC material), stainless, molybdenum and tungsten.

When the material of the protection member 21 is any of carbon material such as graphite, carbon fiber and carbon composite (CC material), metal material such as stainless, molybdenum and tungsten as described above, emissivity of the protection member 21 can be made high, thereby the effect to reduce the exposure of the cooling cylinder 12 to the direct radiant heat from the heater 8 and the raw material melt 5 can be more enhanced. Also, heat resistance of the protection member can be made high.

In this case, the apparatus is preferably provided with the gas flow-guide cylinder 14 extending below the cooling cylinder 12.

When the apparatus is provided with the gas flow-guide cylinder 14 extending below the cooling cylinder 12 as described above, the single crystal 4 can be cooled by shielding the radiant heat from the heater 8 and the raw material melt 5. In addition, the cooling cylinder 12 is prevented from approaching a position immediately above the melt surface so that safety is secured. Moreover the gas flow-guide cylinder exerts an effect to guide the inert gas so as to flow downwardly near the crystal from above the melt, the inert gas which prevents contamination due to an oxidizing gas generated during the pulling of the single crystal, and the cooling effect of the inert gas on the single crystal 4 can be also expected. Consequently, the single crystal 4 during the growth can be more efficiently cooled, and the effect to increase the growth rate of the single crystal 4 can be enhanced.

Furthermore, the cooling cylinder 12 can be kept a sufficient distance from the melt surface having very high temperature, and the breakage, the damage due to melting and the like of the cooling cylinder 12 does not occur which are caused by the raw material melt 5 that splashes to adhere to the cooling cylinder 12, for example, while the raw material is melted. As a result, the single crystal 4 can be extremely safely grown.

As explained above, since the apparatus for producing a single crystal according to the present invention is characterized by having at least the auxiliary cooling cylinder 19 fitted into the inside of the cooling cylinder 12 and by the auxiliary cooling cylinder 19 having the gap 20 penetrating in an axial direction and extending toward the surface of the raw material melt, the apparatus can efficiently cool the single crystal 4 during the growth, and can increase the growth rate of the single crystal 4.

Also, the apparatus can increase the growth rate of the single crystal 4 when the defect-free single crystal is grown.

Hereinafter, the present invention will be explained in more detail based on Examples and Comparative Example, but the present invention is not restricted thereto.

EXAMPLE 1

A silicon single crystal having a diameter of 12 inches (300 mm) was produced by the magnetic field applied Czochralski method (the MCZ method) using the apparatus for producing a single crystal as shown in FIG. 1. A diameter of the crucible 6 was 32 inches (800 mm).

The auxiliary cooling cylinder 19 was used in which the width of the gap 20 was 1.5° as shown in FIG. 2, and graphite, which has heat conductivity equivalent to that of metal and higher emissivity than that of metal, was used as the material thereof.

The single crystal 4 was grown by using the apparatus for producing a single crystal 1 as described above, and the growth rate to enable all the single crystal to be defect-free was sought. Since the growth rate to obtain the defect-free single crystal has a very narrow margin, an appropriate growth rate was easy to decide. Then, the single crystal was sliced into sample and the sample was confirmed whether it was the defect-free single crystal or not by the preferential etching.

As a result, the growth rate was able to be increased by approximately 5.5% in comparison with the case of using the conventional apparatus for producing a single crystal.

As described above, it is confirmed that the apparatus for producing a single crystal 1 of the present application can efficiently cool the single crystal during the growth and can increase the growth rate of the single crystal.

EXAMPLE 2

The single crystal was produced in the same conditions as Example 1 except of using the apparatus for producing a single crystal 1' provided with the graphite protection member 21 outside the cooling cylinder 12 as shown in FIG. 3, and the same evaluation as Example 1 was made.

As a result, the growth rate was able to be increased by approximately 4% in comparison with Example 1.

As described above, it is confirmed that the apparatus for producing a single crystal 1' of the present application can more efficiently cool the single crystal during the growth and can enhance the effect to increase the growth rate of the single crystal.

COMPARATIVE EXAMPLE

Figure 4:
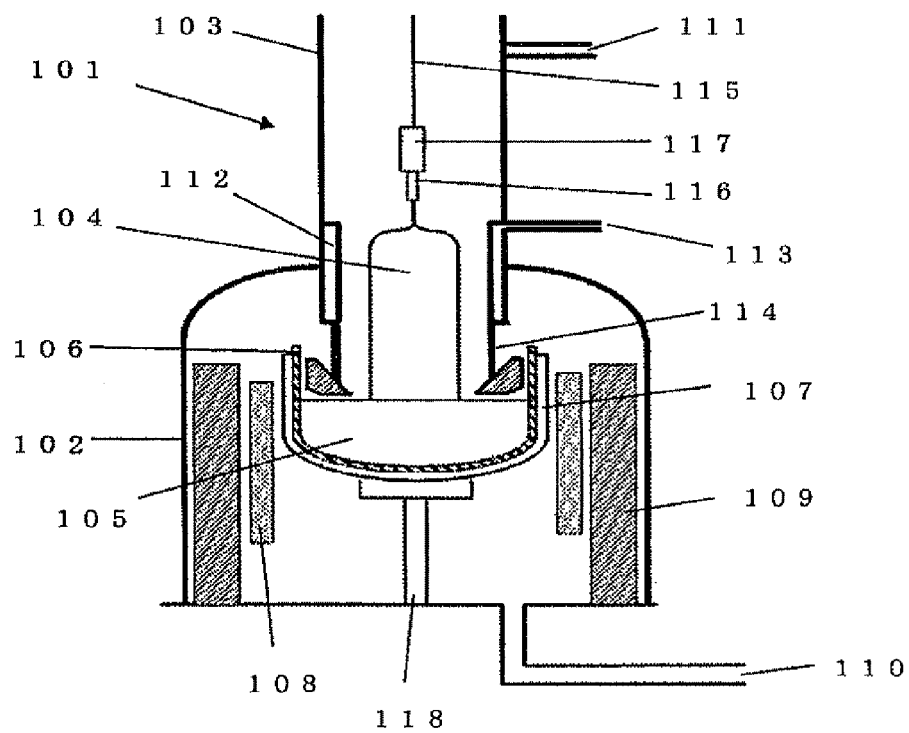
FIG. 4 is a schematic sectional view showing an example of a conventional apparatus for producing a single crystal.

The single crystal was produced in the same conditions as Example 1 except of using the conventional apparatus for producing a single crystal as shown in FIG. 4, and the same evaluation as Example 1 was made. As a result, it was confirmed that the growth rate was decreased by approximately 5.5% in comparison with Example 1.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. An apparatus for producing a single crystal, growing the single crystal by the Czochralski method and comprising at least:
a main chamber in which a crucible for accommodating a raw material melt and a heater for heating the raw material melt are arranged;
a pulling chamber into which the grown single crystal is pulled and accommodated, the pulling chamber being continuously provided above the main chamber;
a cooling cylinder extending at least from a ceiling of the main chamber toward a surface of the raw material melt so as to surround the single crystal during pulling, the cooling cylinder being forcibly cooled with a cooling medium, and
an auxiliary cooling cylinder fitted into an inside of the cooling cylinder,
wherein, the auxiliary cooling cylinder has a slit in a wall of the auxiliary cooling cylinder, the slit penetrating in an axial direction from a top surface of the auxiliary cooling cylinder to a bottom surface of the auxiliary cooling cylinder.

2. The apparatus for producing a single crystal according to claim 1, wherein a material of the auxiliary cooling cylinder is any of graphite, carbon composite, stainless, molybdenum and tungsten.

3. The apparatus for producing a single crystal according to claim 2, wherein a protection member is provided outside the cooling cylinder.

4. The apparatus for producing a single crystal according to claim 3, wherein a material of the protection member is any of graphite, carbon fiber, carbon composite, stainless, molybdenum and tungsten.

5. The apparatus for producing a single crystal according to claim 4, further comprising a gas flow-guide cylinder extending below the cooling cylinder.

6. The apparatus for producing a single crystal according to claim 2, further comprising a gas flow-guide cylinder extending below the cooling cylinder.

7. The apparatus for producing a single crystal according to claim 3, further comprising a gas flow-guide cylinder extending below the cooling cylinder.

8. The apparatus for producing a single crystal according to claim 1, wherein a protection member is provided outside the cooling cylinder.

9. The apparatus for producing a single crystal according to claim 8, wherein a material of the protection member is any of graphite, carbon fiber, carbon composite, stainless, molybdenum and tungsten.

10. The apparatus for producing a single crystal according to claim 9, further comprising a gas flow-guide cylinder extending below the cooling cylinder.

11. The apparatus for producing a single crystal according to claim 8, further comprising a gas flow-guide cylinder extending below the cooling cylinder.

12. The apparatus for producing a single crystal according to claim 1, further comprising a gas flow-guide cylinder extending below the cooling cylinder.

13. The apparatus for producing a single crystal according to claim 1, further comprising a gas flow-guide cylinder extending below the cooling cylinder,
wherein the auxiliary cooling cylinder extends below the cooling cylinder, and the gas flow-guide cylinder is disposed outside the auxiliary cooling cylinder so as to completely surround a portion of the auxiliary cooling cylinder that extends below the cooling cylinder.

14. The apparatus for producing a single crystal according to claim 1, wherein the slit is the only slit in the wall of the auxiliary cooling cylinder.

* * * * *